United States Patent
Kashima et al.

(10) Patent No.: US 7,585,689 B2
(45) Date of Patent: Sep. 8, 2009

(54) METHOD FOR MANUFACTURING SEMICONDUCTOR LASER DEVICE AND METHOD FOR INSPECTING SEMICONDUCTOR LASER BAR

(75) Inventors: Takayuki Kashima, Hyogo (JP); Keiji Ito, Osaka (JP); Kouji Makita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/196,902

(22) Filed: Aug. 22, 2008

(65) Prior Publication Data

US 2009/0053838 A1   Feb. 26, 2009

(30) Foreign Application Priority Data

Aug. 23, 2007   (JP)   ............... 2007-217393

(51) Int. Cl.
*H01L 21/00*   (2006.01)
(52) U.S. Cl. .............. 438/33; 438/28; 438/31; 438/113; 257/E21.214; 257/E21.237; 257/E21.352
(58) Field of Classification Search ........... 438/35, 438/68; 257/E21.35, E21.352, E21.366, 257/E21.483, E21.596
See application file for complete search history.

(56) References Cited

U.S. PATENT DOCUMENTS 4,185,256 A   1/1980   Scifres et al.
7,183,585 B2 *   2/2007   Kuramoto .............. 257/98
2007/0064752 A1   3/2007   Takayama et al.
2009/0101927 A1 *   4/2009   Kohda .................. 257/97

FOREIGN PATENT DOCUMENTS

| JP | 5-75216 | 3/1993 |
|----|---------|--------|
| JP | 9-266347 | 10/1997 |
| JP | 10-190150 | 7/1998 |
| JP | 11-284283 | 10/1999 |
| JP | 2001-345514 | 12/2001 |
| JP | 2006-73851 | 3/2006 |

* cited by examiner

*Primary Examiner*—Savitri Mulpuri
*Assistant Examiner*—Cheung Lee
(74) *Attorney, Agent, or Firm*—Hamre, Schumann, Mueller & Larson, P.C.

(57) ABSTRACT

A method for manufacturing a semiconductor laser device in which a first conductivity type cladding layer, and active layer, a second conductivity type first cladding layer, and a second conductivity type second cladding layer are laminated in this order on a semiconductor substrate by crystal growth, the second conductivity type second cladding layer is processed into a plurality of stripe-shaped ridge structure portions, and a laser bar is formed by cleavage in a direction orthogonal to a longitudinal direction of the ridge structure portions. According to this method, it is possible to provide a method for manufacturing a semiconductor laser device and a method for inspecting a semiconductor laser bar in the manufacturing process, capable of determining for each chip whether or not a deviation of a resonator length is within the tolerance in a simple manner.

9 Claims, 8 Drawing Sheets

METHOD FOR MANUFACTURING SEMICONDUCTOR LASER DEVICE AND METHOD FOR INSPECTING SEMICONDUCTOR LASER BAR

BACKGROUND OF THE INVENTION

1. Field of the Invention

The present invention relates to a method for manufacturing a semiconductor laser device and a method for inspecting a semiconductor laser bar in the manufacturing process, for the purpose of increasing the accuracy of the length of a resonator.

2. Description of Related Art

In recent years, the use of drives for recording/reproducing DVDs characterized by a large storage capacity has become widespread rapidly in various fields, including video disc players. Moreover, it strongly is desired that the same device can be used for readout of conventionally used CDs, CD-Rs, and CD-RWs as well. For this reason, an optical pickup used for recording/reproducing DVDs and CDs includes as a light source an infrared semiconductor laser with an emission wavelength band of 780 nm for CDs in combination with a red semiconductor laser with an emission wavelength band of 650 nm for DVDs.

As information processing devices such as a personal computer have become more compact, devices for recording/reproducing DVDs and the like also have to be smaller and thinner. To this end, it is indispensable to make an optical pickup smaller and thinner. In order to achieve a smaller and thinner optical pickup, it is effective to simplify a device by reducing the number of optical components. As one means for simplification, a red semiconductor laser and an infrared semiconductor laser may be integrated.

In terms of the reduction in the size of a device and the number of components, a monolithic two-wavelength semiconductor laser recently has been mass-produced, in which a red semiconductor laser and an infrared semiconductor laser are integrated on the same semiconductor substrate. With this configuration, it is possible not only to integrate the semiconductor lasers themselves into one component but also to share optical components such as a collimator lens and a beam splitter between the red semiconductor laser and the infrared semiconductor laser, which contributes to a smaller and thinner device.

Further, to meet the demand for high-speed writing (recording) in recent years, a monolithic two-wavelength laser operable at a high output has been proposed (see JP 2001-345514 A, for example).

Furthermore, as semiconductor lasers have increased output, it is required to make a resonator as an optical waveguide longer so as to improve heat dissipation of a laser chip. For example, it is said that in the case of a semiconductor laser with an emission wavelength band of 650 nm, a resonator length of 1000 μm or more is required to ensure an optical output level of 200 mW or more.

However, the longer the resonator of the semiconductor laser becomes, the more an optical axis shift is affected by a rotation error and the like caused in a process of assembly on a sub-mount. In addition, fluctuations of a coherent length become greater. Thus, in order to make the resonator longer, it is necessary to reduce variations in resonator length itself.

In general, during the manufacture of a semiconductor laser, in order to separate a semiconductor laser wafer having a stripe-shaped light emitting area into bar shapes, scribe lines are formed on a wafer surface in a direction orthogonal to a stripe direction. Then, a load is applied to the wafer along the scribe lines, so that the wafer is cleaved into bar shapes. A method for cleaving a tilted substrate that generally is used for forming a semiconductor laser with an emission wavelength band of 650 nm is disclosed in JP 09(1997)-266347 A, for example.

Cleavage surfaces formed at both ends of each of the laser bars are used as mirrors, and a distance between the mirrors is a resonator length. Thus, variations in resonator length depend on variations occurring in the cleavage process, such as a deviation of a wafer crystal orientation and a deviation of the scribe lines and the like. The resonator length is measured by using a measuring device such as an optical microscope and a SEM (scanning electron microscope) after the cleavage process.

However, according to the above-described conventional method for measuring the resonator length, the measurement is performed for each chip, and thus a total measuring time becomes longer, resulting in more expense and time required for the manufacturing process. Further, according to the measuring method using a microscope, as the resonator becomes longer, the observation field of view has to be broadened, which might result in a considerable measuring error.

SUMMARY OF THE INVENTION

With the foregoing in mind, it is an object of the present invention to provide a method for manufacturing a semiconductor laser device and a method for inspecting a semiconductor laser bar in the manufacturing process, capable of determining for each chip whether or not a deviation of the resonator length is within the tolerance in a simple manner.

In a method for manufacturing a semiconductor laser device according to the present invention, a first conductivity type cladding layer, an active layer, a second conductivity type first cladding layer, and a second conductivity type second cladding layer are laminated in this order on a semiconductor substrate by crystal growth. The second conductivity type second cladding layer is processed into a plurality of stripe-shaped ridge structure portions, and a laser bar is formed by cleavage in a direction orthogonal to a longitudinal direction of the ridge structure portions. To solve the above-described problems, a plurality of columns of the ridge structure portions that are aligned in the longitudinal direction of the ridge structure portions at predetermined intervals are arranged in a direction perpendicular to the longitudinal direction of the ridge structure portions with spaces therebetween. The arrangement is such that each of the columns is displaced from the column adjacent in the width direction (the direction perpendicular to the longitudinal direction) of the ridge structure portions in the longitudinal direction of the ridge structure portions so that an end portion of each of the ridge structure portions and an end portion of the ridge structure portion adjacent in the width direction of the ridge structure portions overlap each other in the longitudinal direction of the ridge structure portions. A region where the end portion of each of the ridge structure portions and the end portion of the adjacent ridge structure portion overlap each other is cleaved.

A method for inspecting a semiconductor laser bar according to the present invention is performed after the cleavage in the method for manufacturing a semiconductor laser device. Ridge structure portions remaining in cleaved portions are observed in terms of their arrangement and shape, thereby determining whether the semiconductor laser bar is defective.

DETAILED DESCRIPTION OF THE INVENTION

Figure 1A:
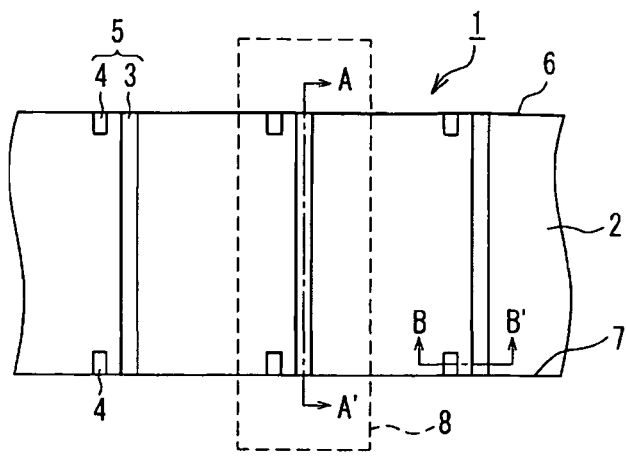
FIG. 1A is a plan view showing a configuration of a semiconductor laser bar according to an embodiment of the present invention.

According to a method for manufacturing a semiconductor laser device of the present invention, a plurality of columns of the ridge structure portions that are aligned in the longitudinal direction of the ridge structure portions at predetermined intervals are arranged in a direction perpendicular to the longitudinal direction of the ridge structure portions with spaces therebetween. The arrangement is such that each of the columns is displaced from the column adjacent in the width direction of the ridge structure portions in the longitudinal direction of the ridge structure portions so that an end portion of each of the ridge structure portions and an end portion of the ridge structure portion adjacent in the width direction of the ridge structure portions overlap each other in the longitudinal direction of the ridge structure portions. A region where the end portion of each of the ridge structure portions and the end portion of the adjacent ridge structure portion overlap each other is cleaved.

A method for inspecting a semiconductor laser bar according to the present invention is performed after the cleavage in the method for manufacturing a semiconductor laser device. Ridge structure portions remaining in cleaved portions are observed in terms of their arrangement and shape, thereby determining whether the semiconductor laser bar is defective.

Based on the above-described configurations, the method for manufacturing a semiconductor laser device and the method for inspecting a semiconductor laser bar of the present invention can assume the following various embodiments.

That is, the method for manufacturing a semiconductor laser device as described above may include, after the formation of the ridge structure portions, forming a current blocking layer in an end region of each of the ridge structure portions so as to cover the second conductivity type second cladding layer.

Further, the current blocking layer may be formed of a first conductivity type semiconductor layer.

Further, the current blocking layer may be a single layer film of Si, $SiN_x$, $SiO_2$, $TiO_2$, $Ta_2O_5$, $NbO_x$, or hydrogenated amorphous silicon or a dielectric film in which at least two of the single layer films are laminated.

Further, when a tolerance of variations in a length of a resonator formed by cleaving each of the ridge structure portions is ±A, a region where the end portion of each of the ridge structure portions and the end portion of the ridge structure portion adjacent in the direction perpendicular to the longitudinal direction of the ridge structure portions overlap each other may be A/2 in length.

Further, in the method for inspecting a semiconductor laser bar as described above, unless a part of the ridge structure portion adjacent in a direction perpendicular to a longitudinal direction of the ridge structure portions remains at least at one of both ends of the cleaved portions, the semiconductor laser bar may be determined to be defective.

Further, the inspection according to the method for inspecting a semiconductor laser bar as described above may be performed in combination with a characteristic inspection by which the semiconductor laser bar is determined to be defective unless a semiconductor laser device oscillates.

Hereinafter, a semiconductor laser device, a method for manufacturing the same, and an inspection method according to an embodiment of the present invention will be described with reference to the drawings.

EMBODIMENT

Figure 1B:
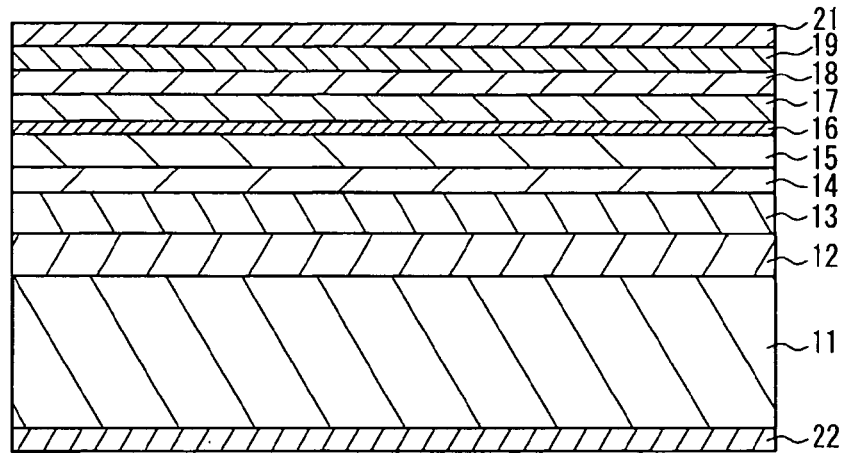
FIG. 1B is a cross-sectional view showing the configuration of the semiconductor laser bar according to the embodiment of the present invention, taken along a line A-A'.
Figure 1C:
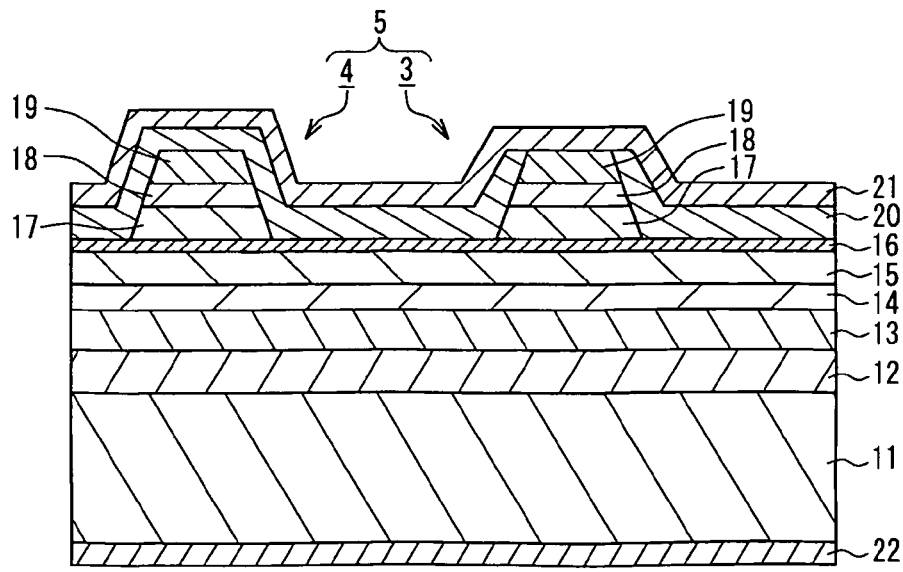
FIG. 1C is a cross-sectional view showing the configuration of the semiconductor laser bar according to the embodiment of the present invention, taken along a line B-B'.

FIG. 1A is a plan view showing a semiconductor laser bar 1 in which a plurality of semiconductor laser devices 8 are formed according to an embodiment of the present invention. FIG. 1B is an enlarged cross-sectional view taken along a line A-A' in FIG. 1A, and FIG. 1C is an enlarged cross-sectional view taken along a line B-B' in FIG. 1A. As shown in FIG. 1A, the semiconductor laser bar 1 includes a flat portion 2 and ridge structure portions 5. The laser bar 1 has a pair of opposed end faces (a first end face 6 and a second end face 7) formed by cleavage. Each of the ridge structure portions 5 includes a resonator 3 for causing laser oscillation and mark portions 4 for detecting the length of the resonator 3. The resonator 3 is formed from the first end face 6 to the second end face 7 and is cleaved at the portions of the first end face 6 and the second end face 7, and has a length (resonator length) of 1000 μm, for example. The mark portions 4 are formed in parallel with the resonator 3 in the vicinities of the first end face 6 and the second end face 7, respectively.

As shown in FIG. 1C, the laser bar 1 has a configuration in which a semiconductor substrate 11, a buffer layer 12, an n-type cladding layer (first conductivity type cladding layer) 13, an active layer 14, a p-type first cladding layer (second conductivity type first cladding layer) 15, and an etching stop layer 16 are laminated in this order. The ridge structure portion 5 includes laminates of a p-type second cladding layer (second conductivity type second cladding layer) 17, a p-type intermediate layer 18, and a p-type contact layer 19.

The resonator 3 includes a current blocking layer 20 formed on side surfaces of the laminate of the p-type second cladding layer 17, the p-type intermediate layer 18, and the p-type contact layer 19. A p-side electrode 21 is formed on side surfaces of the current blocking layer 20 and on the laminate. Each of the mark portions 4 includes the current blocking layer 20 formed so as to cover the laminate of the p-type second cladding layer 17, the p-type intermediate layer 18, and the p-type contact layer 19, and the p-side electrode 21 formed so as to cover the current blocking layer 20.

The semiconductor substrate 11 is made of n-type GaAs. The buffer layer 12 is made of n-type GaAs and is formed on the semiconductor substrate 11. The n-type cladding layer 13 is made of n-type $(Al_xGa_{1-x})_yIn_{1-y}P$ ($0<x<1$, $0<y<1$). The active layer 14 is made of a laminate of a GaInP layer and an AlGaInP layer. The p-type first cladding layer 15 is made of p-type $(Al_xGa_{1-x})_yIn_{1-y}P$ ($0<x<1$, $0<y<1$). The etching stop layer 16 is made of p-type GaInP.

The p-type second cladding layer 17 is made of p-type $(Al_xGa_{1-x})_yIn_{1-y}P$ ($0<x<1$, $0<y<1$) and is formed on the etching stop layer 16. The p-type intermediate layer 18 is made of p-type GaInP. The p-type contact layer 19 is made of p-type GaAs. The current blocking layer 20 is made of an n-type semiconductor. An n-side electrode 22 is formed on the back surface of the semiconductor substrate 11.

It should be noted that x and y of the n-type cladding layer 13, the p-type first cladding layer 15, and the p-type second cladding layer 17 may be, for example, 0.7 and 0.5, respectively.

Figure 2A:
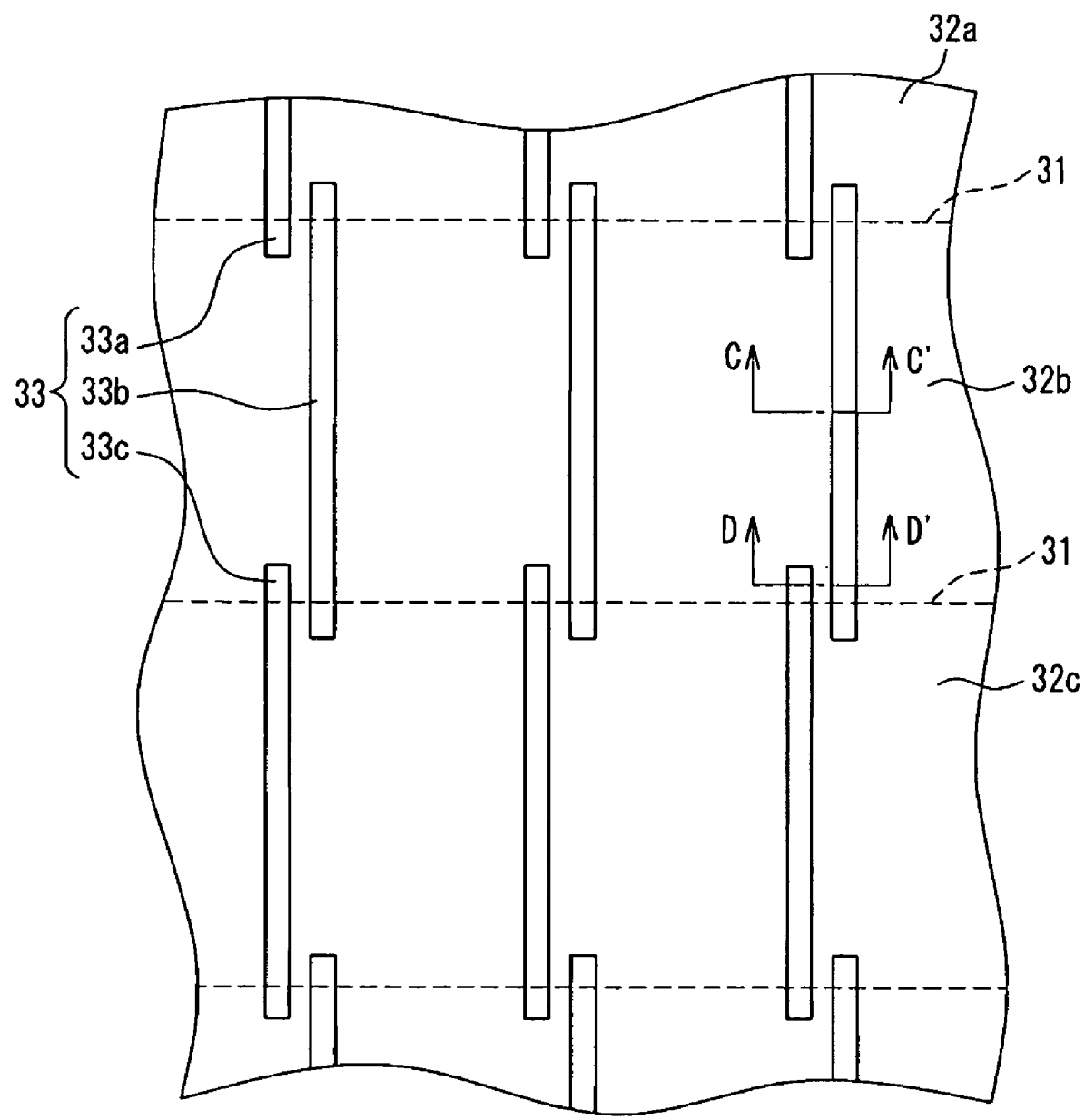
FIG. 2A is a plan view showing a manufacturing process of a semiconductor laser device according to the embodiment of the present invention.
Figure 2B:
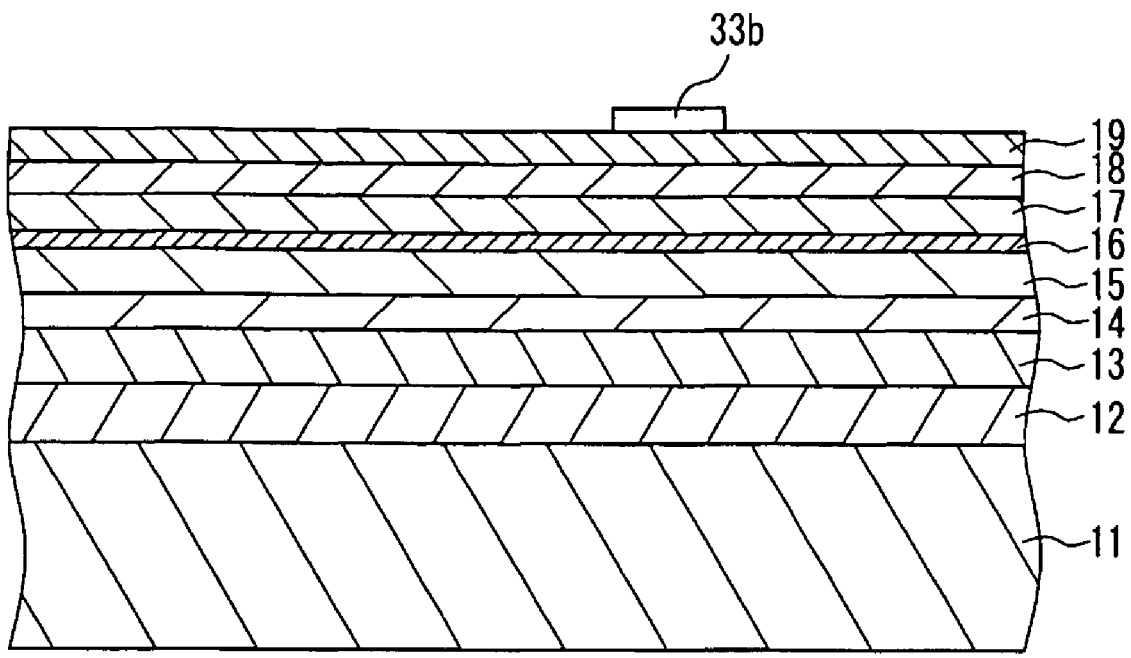
FIG. 2B is a cross-sectional view showing the manufacturing process of the semiconductor laser device according to the embodiment of the present invention, taken along a line C-C'.
Figure 2C:
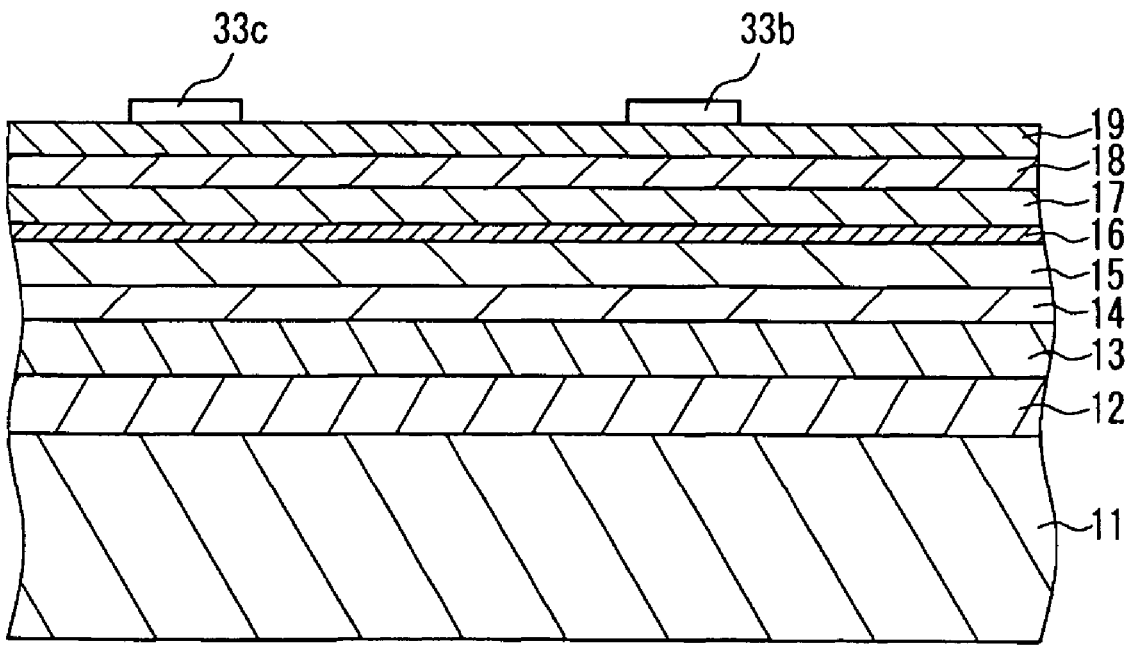
FIG. 2C is a cross-sectional view showing the manufacturing process of the semiconductor laser device according to the embodiment of the present invention, taken along a line D-D'.
Figure 3A:
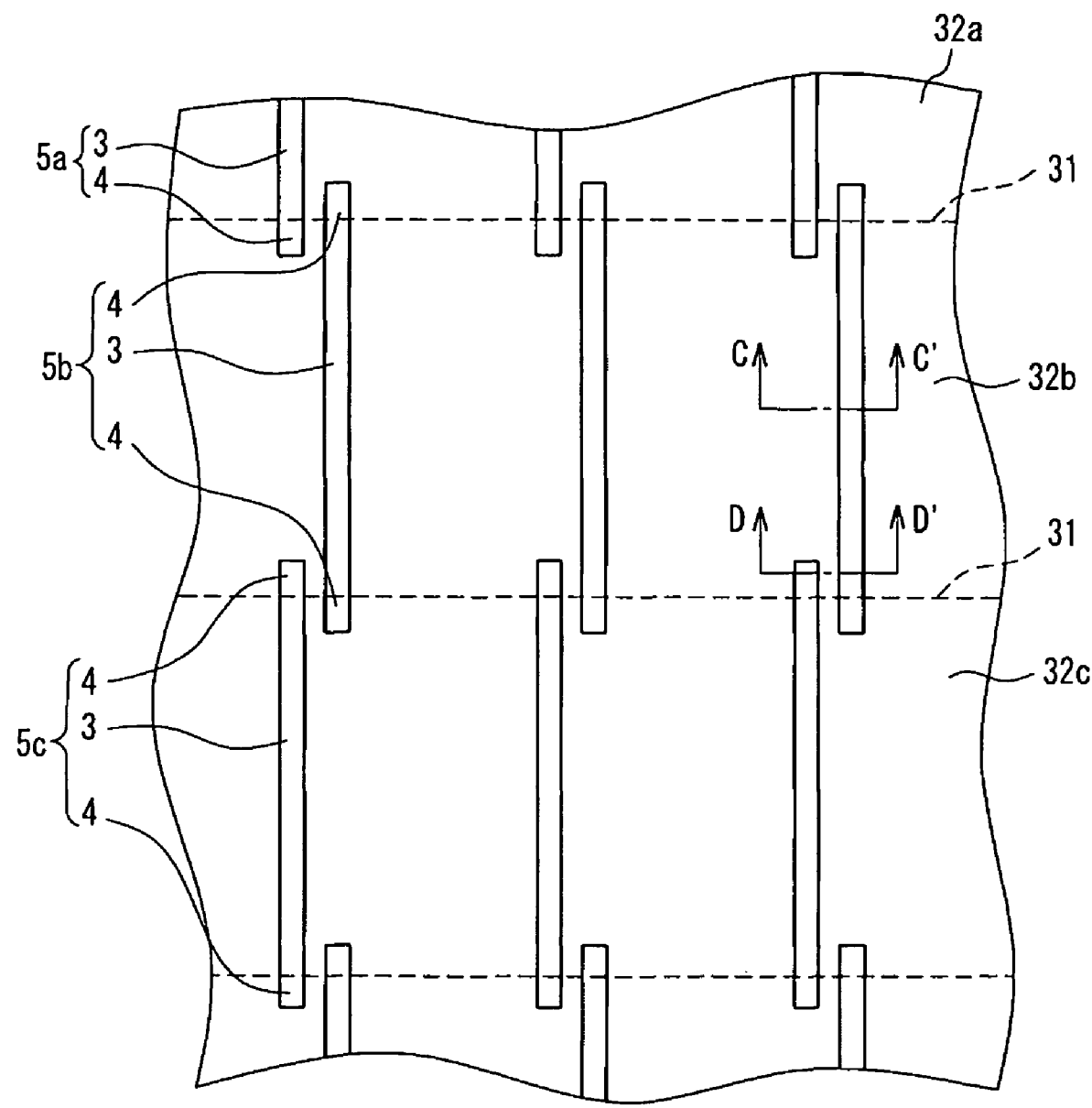
FIG. 3A is a plan view showing a process subsequent to FIG. 2A.
Figure 3B:
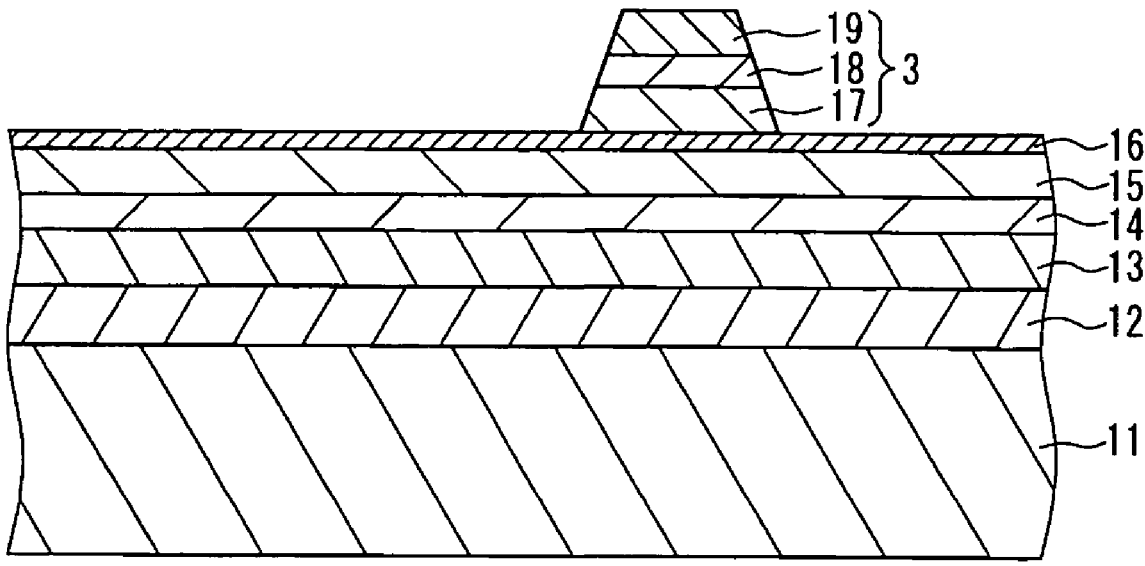
FIG. 3B is a cross-sectional view taken along a line C-C' in FIG. 3A.
Figure 3C:
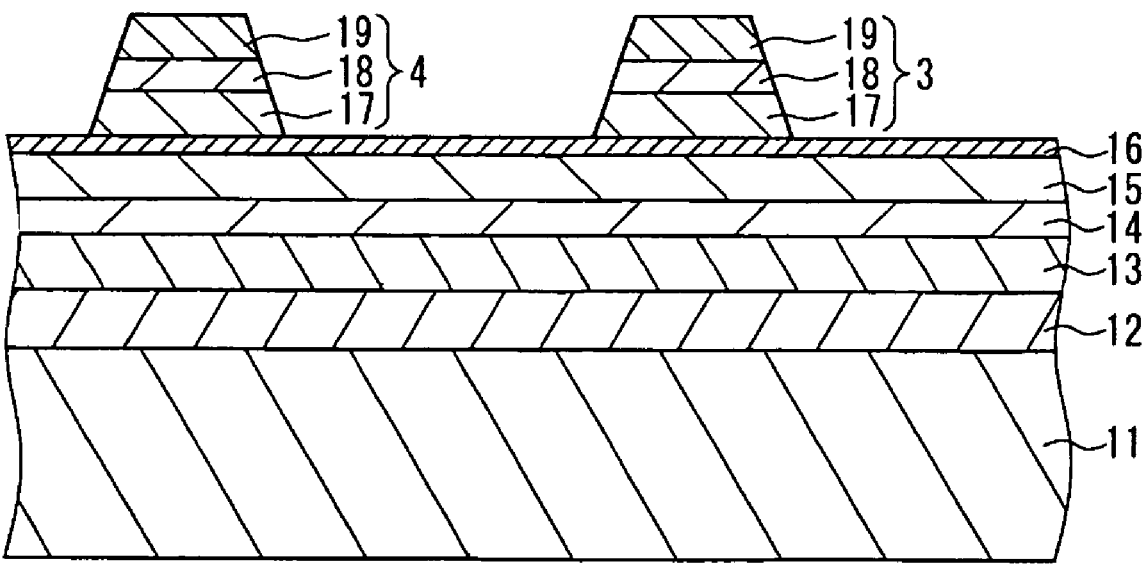
FIG. 3C is a cross-sectional view taken along a line D-D' in FIG. 3A.
Figure 4:
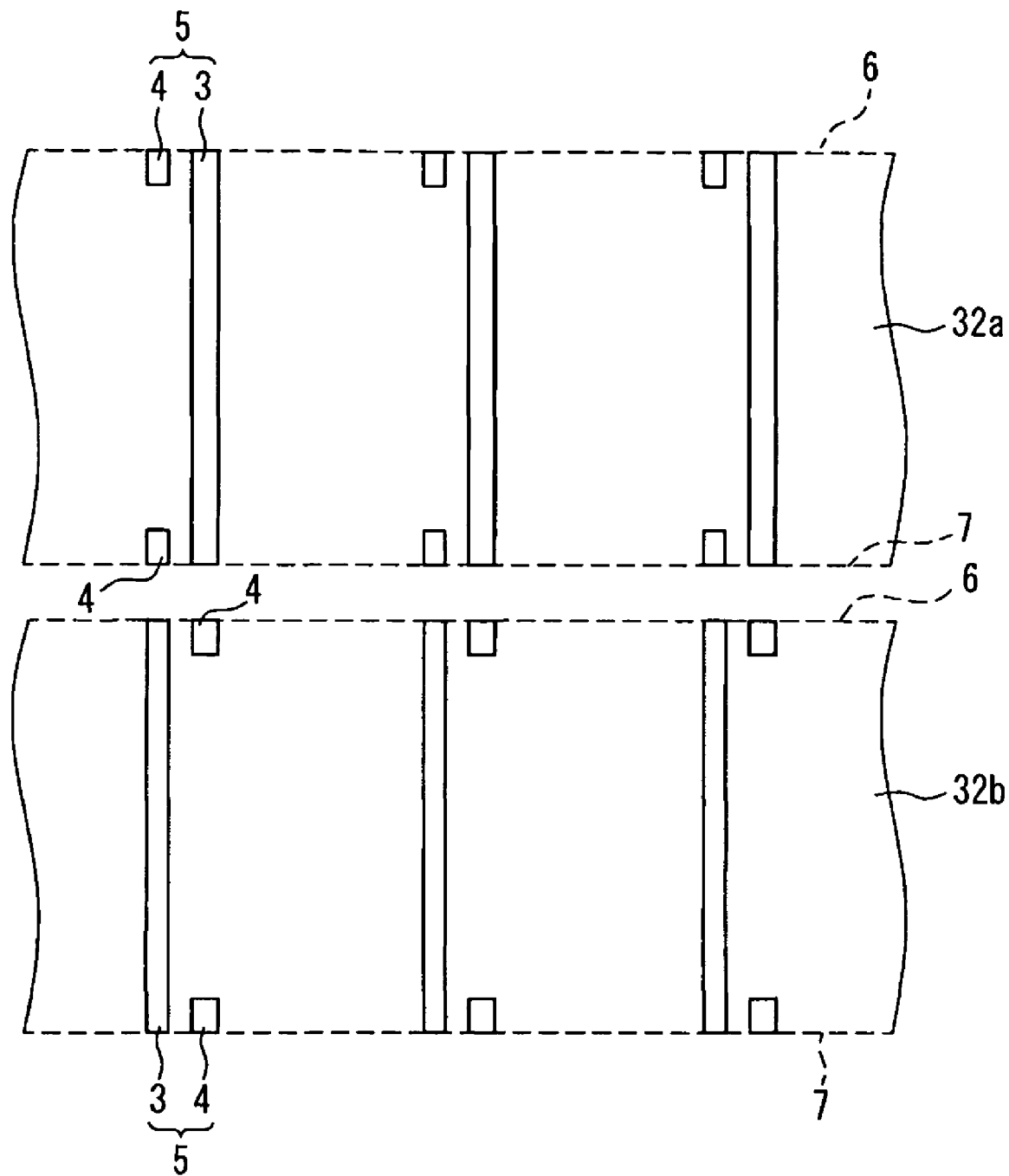
FIG. 4 is a plan view showing a state in which the semiconductor laser bar according to the embodiment of the present invention is cleaved.

Next, a method for manufacturing the semiconductor laser device 8 according to the present embodiment will be described. FIGS. 2 to 4 are views showing respective steps in the method for manufacturing the semiconductor laser device 8. Since the semiconductor laser bar 1 has different cross-sectional shapes between the vicinities of the end faces and a central region (gain region), the separate cross-sectional views showing respective steps are provided to illustrate the vicinity of the end face of the resonator and the gain region, respectively. Namely, FIGS. 2A and 3A are plan views of the semiconductor laser bar 1 in the manufacturing process, FIGS. 2B and 3B are cross-sectional views (of the gain region) taken along lines C-C' in FIGS. 2A and 3A, respectively, and FIGS. 2C and 3C are cross-sectional views (in the vicinity of the end face of the resonator 3) taken along lines D-D' in FIGS. 2A and 3A, respectively. FIG. 4 is a plan view showing a state in which the flat portion 2 is cleaved along cutting lines 31.

Initially, as shown in FIGS. 2B and 2C, the buffer layer 12, the n-type cladding layer 13, the active layer 14, the p-type first cladding layer 15, the etching stop layer 16, the p-type second cladding layer 17, the p-type intermediate layer 18, and the p-type contact layer 19 are laminated in this order on the semiconductor substrate 11 by using a metal organic chemical vapor deposition (MOCVD) method. Each broken line in FIG. 2A indicates the line (hereinafter, referred to as the cutting line) 31 along which the flat portion 2 is to be cleaved in a later step so as to form the first end face 6 or the second end face 7. In FIG. 2A, a first region 32a, a second region 32b, and a third region 32c are defined respectively by the cutting lines 31.

Then, on the p-type contact layer 19, a $SiO_2$ film is formed, which is patterned by using a photolithography technique and a dry etching technique, thereby forming stripe-shaped mask patterns 33a to 33c in a region to be the ridge structure portion 5 shown in FIG. 1A. The $SiO_2$ masks formed in the regions 32a to 32c are the first $SiO_2$ mask 33a, the second $SiO_2$ mask 33b, and the third $SiO_2$ mask 33c, respectively. The $SiO_2$ film 33 is formed so that a first ridge structure portion 5a and a ridge structure portion (third ridge structure portion 5c) in the third region 32c are, for example, 10 μm away from a second ridge structure portion 5b in a direction perpendicular to a longitudinal direction of the second ridge structure portion 5b. The semiconductor laser bar 1 is formed similarly in each of the first region 32a, the second region 32b, and the third region 32c, and the following detailed description is directed to the second region 32b.

The second $SiO_2$ mask 33b is formed between the cutting lines 31 of the second region 32b, and further is formed astride the cutting lines 31 so as to extend to the first region 32a and the third region 32c. Further, in the vicinities of the respective cutting lines 31 of the second region 32b, the first $SiO_2$ mask 33a and the third $SiO_2$ mask 33c extending from the first region 32a and the third region 32c, respectively, are formed in parallel with the second $SiO_2$ mask 33b. The first $SiO_2$ mask 33a and the third $SiO_2$ mask 33c are formed in alignment with each other, and form a broken line shape that is cut in the second region 32b. Similarly to the first $SiO_2$ mask 33a and the third $SiO_2$ mask 33c, the second $SiO_2$ mask 33b also forms a broken line shape that is cut in the first region 32a and the third region 32c in the longitudinal direction.

In the case where the tolerance of variations in the length of the resonator 3 is ±A, the second $SiO_2$ mask 33b is formed so as to extend A/4 in length to the first region 32a and the third region 32c, respectively. Namely, a region where the second $SiO_2$ mask 33b overlaps an end portion of the first $SiO_2$ mask 33a in a direction orthogonal to the longitudinal direction is A/2 in length. More specifically, in the case where the tolerance is ±10 μm, the first $SiO_2$ mask 33a and the third $SiO_2$ mask 33c each extend 2.5 μm in length to the second region 32b.

Then, as shown in FIGS. 3B and 3C, the p-type contact layer 19, the p-type intermediate layer 18, and the p-type second cladding layer 17 are etched by using the mask pattern, thereby defining the ridge structure portion 5. As shown in FIG. 3A, portions masked by the first $SiO_2$ mask 33a, the second $SiO_2$ mask 33b, and the third $SiO_2$ mask 33c become the first ridge structure portion 6a, the second ridge structure portion 5b, and the third ridge structure portion 5c, respectively. The ridge structure portion 5 is formed so as to be displaced in the longitudinal direction and so that its end portion partially overlaps another end portion of the adjacent ridge structure portion 5 in the direction perpendicular to the longitudinal direction.

In the present embodiment, in order to form the ridge structure portion 5, dry etching using inductively coupled plasma or reactive ion plasma, for example, may be performed in combination with wet etching.

Then, the $SiO_2$ film 33 used as a mask is removed. After that, although not shown, the current blocking layer 20 is formed on the side surfaces of the ridge structure portion 5 and on the etching stop layer 16. At this time, in order to form the current blocking layer 20, a region to be the resonator 3 is masked while a region (end region) to be the mark portion 4 is not masked in the ridge structure portion 5. Here, the end region, which is defined before the following cleavage process, refers not only to the portion actually to be the mark portion 4 but also to a certain region from each end portion (e.g., a region A/4 from each end portion) of the ridge structure portion 5 before cleavage. When the current blocking layer 20 is formed in this manner, no reactive current is applied to the mark portion 4 that does not oscillate as a semiconductor laser, thereby preventing excess heat generation. Thereafter, the p-side electrode 21 is formed on the current blocking layer 20 and the p-type contact layer 19, and the n-side electrode 22 is formed on the back surface of the semiconductor substrate 11.

Then, the flat portion 2 and the ridge structure portion 5 are cleaved along the cutting line 31. The cleavage is performed by a generally used method, i.e., by forming a scribe line on a surface of the flat portion 2 in the direction orthogonal to the longitudinal direction of the ridge structure portion 5 and applying a load to a wafer along the scribe line.

The semiconductor laser bar 1 can be manufactured by the above-described process. When the semiconductor laser bar 1 is manufactured in this manner, end portions of both the first ridge structure portion 5a and the third ridge structure portion 5c remain in the flat portion 2 of the second region 32b so as to serve as the mark portions 4 after the cleavage.

Next, a description will be given of a method of inspection as to whether or not the length of the resonator 3 is within the tolerance, which is performed after the cleavage. Initially, it is determined whether or not the mark portions 4 formed of the extended first ridge structure portion 5a and third ridge structure portion 5c are present in the semiconductor laser bar 1 of the second region 32b.

FIG. 4 is a plan view showing a state in which the flat portion 2 and the ridge structure portions 5 are cleaved so that the resonator length is within the tolerance. In this case, the mark portions 4 are present in the vicinities of the first end face 6 and the second end face 7 in the second region 32b. This indicates that an error of the resonator length is within ±5 μm at each end portion of the resonator 3 and a total error of the resonator length is within ±10 μm as described above.

Figure 5:
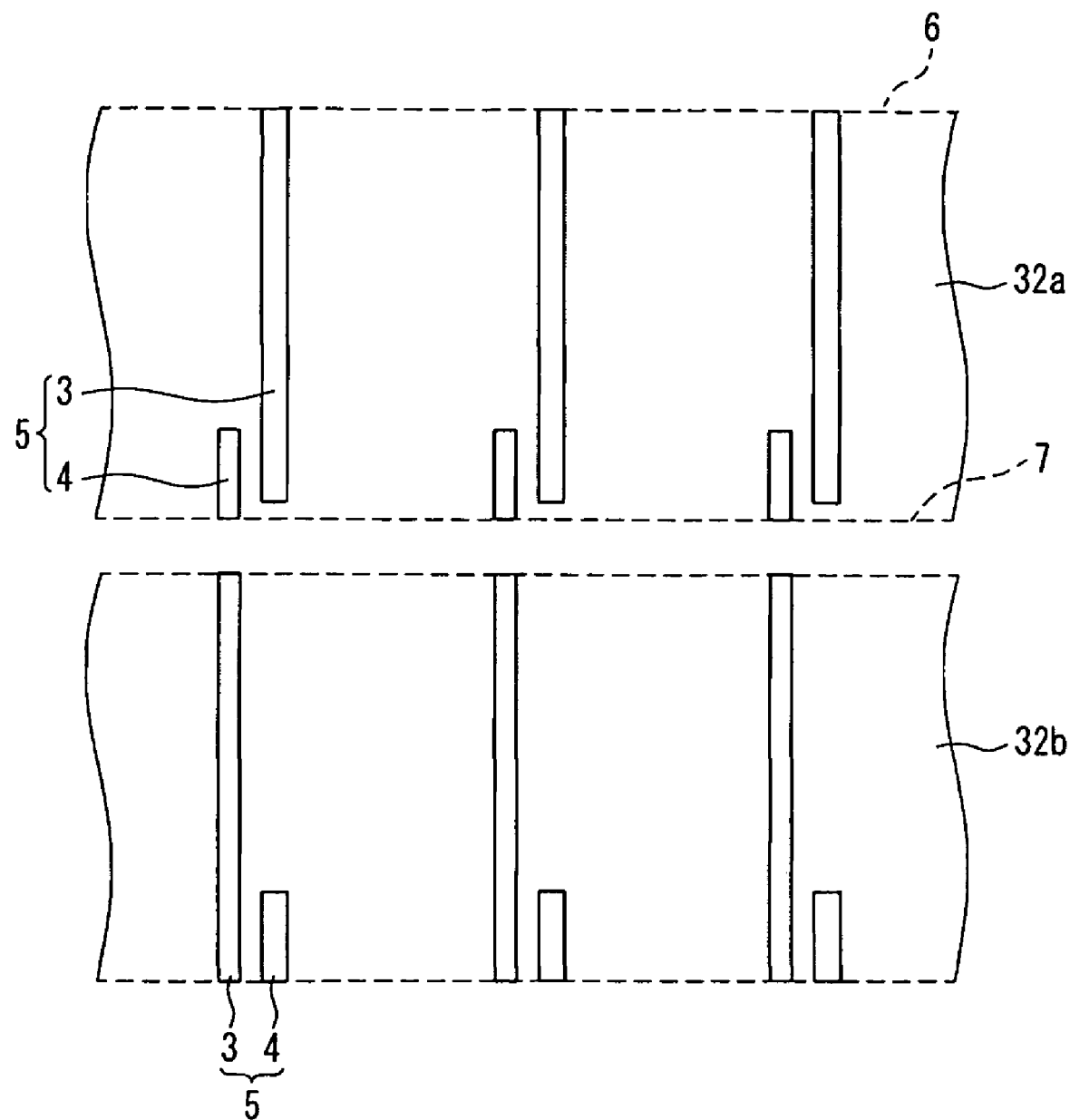
FIG. 5 is a plan view showing a state in which the semiconductor laser bar according to the embodiment of the present invention is cleaved at another position.

FIG. 5 is a plan view showing a state in which the mark portions 4 are present only at one end portion in the semiconductor laser bar 1 of the second region 32b when the flat portion 2 and the ridge structure portions 5 are cleaved. In this case, the length of the resonator 3 might not be within the tolerance. Therefore, the semiconductor laser bar 1 in which the mark portions 4 are present only at one end portion is determined to be defective. Further, the semiconductor laser bar 1 in which no mark portion 4 is present at either end portion also is determined to be defective.

Figure 6:
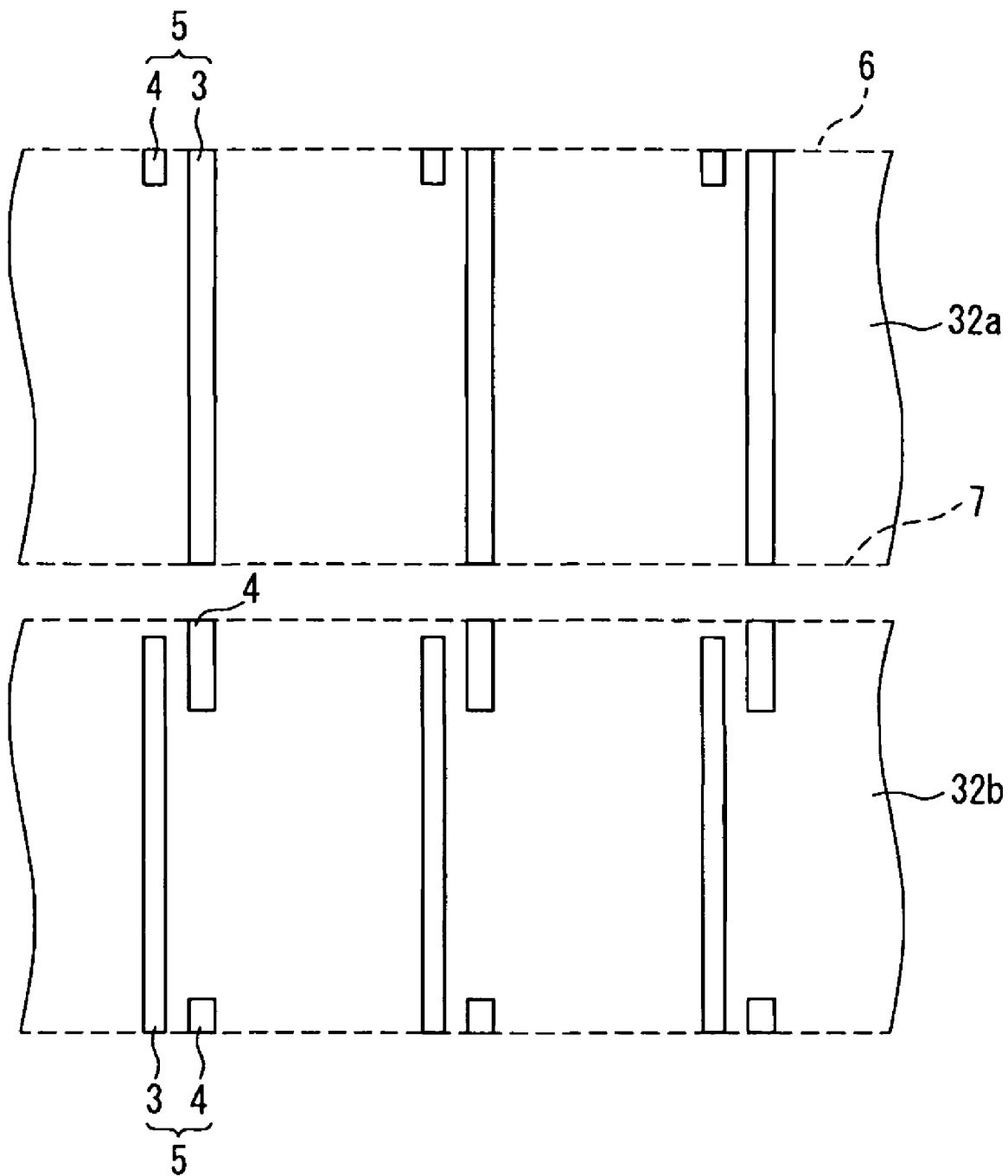
FIG. 6 is a plan view showing a state in which the semiconductor laser bar according to the embodiment of the present invention is cleaved at still another position.

Then, a current is applied to the semiconductor laser bar 1 in which the mark portions 4 are present at both the end portions, thereby performing an inspection as to whether or not laser oscillation occurs. With respect to the semiconductor laser bars 1 shown in FIG. 4, since the resonator length is within the tolerance, and the resonator 3 is cleaved at its both ends, laser oscillation occurs upon application of a current. On the other hand, with respect to the semiconductor laser bar 1 shown on the lower side of FIG. 6, although the mark portions 4 are present at both end portions, the resonator 3 is not cleaved at its one end, and therefore no laser oscillation occurs even upon application of a current. The semiconductor laser bar 1 that does not oscillate is determined to be defective.

As described above, according to the present embodiment, the presence of the mark portion 4 is confirmed by using an inspection device such as an optical microscope, and a current is applied to the semiconductor laser bar 1 to cause laser oscillation. Therefore, it is possible to perform an inspection as to whether or not the resonator length after the cleavage is within specifications easily and with high accuracy. Since this process does not require measuring the resonator length, an inspection time can be reduced significantly. Further, it becomes significantly less likely that the semiconductor laser bar is determined to be defective by an inspection performed after integration into a pickup and the like, which contributes to a great reduction in cost.

The semiconductor laser bar that is not determined to be defective by the above-described inspection is cut with respect to each resonator, followed by wiring and the like, thereby forming the semiconductor laser device 8.

Although not shown, the current blocking layer 20 of an n-type semiconductor layer is exemplified in the present embodiment. However, the current blocking layer 20 is not limited thereto, and may be a single layer film of Si, $SiN_x$, $SiO_2$, $TiO_2$, $Ta_2O_5$, $NbO_x$, hydrogenated amorphous silicon, or the like, for example, or a dielectric film formed of a multilayer film in which at least two of these single layer films are laminated.

It should be understood that the present embodiment is applicable to overall semiconductor laser devices having a waveguide, such as a monolithic multi-wavelength semiconductor laser device and a blue-violet semiconductor laser device.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor laser device in which a first conductivity type cladding layer, an active layer, a second conductivity type first cladding layer, and a second conductivity type second cladding layer are laminated in this order on a semiconductor substrate by crystal growth, the second conductivity type second cladding layer is processed into a plurality of stripe-shaped ridge structure portions, and a laser bar is formed by cleavage in a direction orthogonal to a longitudinal direction of the ridge structure portions, the method comprising:
   arranging a plurality of columns of the ridge structure portions that are aligned in the longitudinal direction of the ridge structure portions at predetermined intervals, in a direction perpendicular to the longitudinal direction of the ridge structure portions with spaces therebetween;
   the arrangement being such that each of the columns is displaced from the column adjacent in the width direction of the ridge structure portions in the longitudinal direction of the ridge structure portions so that an end portion of each of the ridge structure portions and an end portion of the ridge structure portion adjacent in the width direction of the ridge structure portions overlap each other in the longitudinal direction of the ridge structure portions; and
   cleaving a region where the end portion of each of the ridge structure portions and the end portion of the adjacent ridge structure portion overlap each other.

2. The method for manufacturing a semiconductor laser device according to claim 1, comprising, after the formation of the ridge structure portions, forming a current blocking layer in an end region of each of the ridge structure portions so as to cover the second conductivity type second cladding layer.

3. The method for manufacturing a semiconductor laser device according to claim 2, wherein the current blocking layer is formed of a first conductivity type semiconductor layer.

4. The method for manufacturing a semiconductor laser device according to claim 2, wherein the current blocking layer is a single layer film of Si, $SiN_x$, $SiO_2$, $TiO_2$, $Ta_2O_5$, NbO$_x$, or hydrogenated amorphous silicon or a dielectric film in which at least two of the single layer films are laminated.

5. The method for manufacturing a semiconductor laser device according to claim 1, wherein when a tolerance of variations in a length of a resonator formed by cleaving each of the ridge structure portions is ±A, a region where the end portion of each of the ridge structure portions and the end portion of the ridge structure portion adjacent in the direction perpendicular to the longitudinal direction of the ridge structure portions overlap each other is A/2 in length.

6. A method for inspecting a semiconductor laser bar, which is performed after the cleavage in the method for manufacturing a semiconductor laser device according to claim 1, the method comprising observing ridge structure portions remaining in cleaved portions in terms of their arrangement and shape, thereby determining whether the semiconductor laser bar is defective.

7. The method for inspecting a semiconductor laser bar according to claim 6, wherein unless a part of the ridge structure portion adjacent in a direction perpendicular to a longitudinal direction of the ridge structure portions remains at least at one of both ends of the cleaved portions, the semiconductor laser bar is determined to be defective.

8. A method for inspecting a semiconductor laser bar, the method comprising: performing the inspection according to the method for inspecting a semiconductor laser bar according to claim 6; and performing an inspection by which the semiconductor laser bar is determined to be defective unless a semiconductor laser device oscillates.

9. A method for inspecting a semiconductor laser bar, the method comprising: performing the inspection according to the method for inspecting a semiconductor laser bar according to claim 7; and performing an inspection by which the semiconductor laser bar is determined to be defective unless a semiconductor laser device oscillates.

* * * * *